United States Patent
Seuh et al.

(10) Patent No.: US 11,391,874 B1
(45) Date of Patent: Jul. 19, 2022

(54) DISPLAY HAVING A COMPENSATION FILM WITH LIGHT ABSORBING DYE

(71) Applicant: Apple Inc., Cupertino, CA (US)

(72) Inventors: Jung Yun Seuh, Sunnyvale, CA (US); Se Hyun Ahn, Cupertino, CA (US); Zhibing Ge, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 134 days.

(21) Appl. No.: 16/897,154

(22) Filed: Jun. 9, 2020

Related U.S. Application Data

(60) Provisional application No. 62/901,116, filed on Sep. 16, 2019.

(51) Int. Cl.
  *G02B 5/00*   (2006.01)
  *G02B 5/30*   (2006.01)
  *G02B 5/22*   (2006.01)
  *G02F 1/13363*   (2006.01)
  *H01L 51/52*   (2006.01)
  *C09K 19/52*   (2006.01)

(52) U.S. Cl.
  CPC ............ *G02B 5/3016* (2013.01); *C09K 19/52* (2013.01); *G02B 5/223* (2013.01); *G02F 1/13363* (2013.01); *H01L 51/5275* (2013.01); *H01L 51/5281* (2013.01); *C09K 2323/031* (2020.08); *G02F 1/133633* (2021.01); *G02F 1/133638* (2021.01)

(58) Field of Classification Search
  CPC .................. G02B 5/3016; G02B 5/223; G02F 1/13363; G02F 1/133633; G02F 1/133638; H01L 51/5275; H01L 51/5281; C09K 2323/00
  See application file for complete search history.

(56) References Cited

U.S. PATENT DOCUMENTS

| | | | |
|---|---|---|---|
| 4,707,080 A | 11/1987 | Fergason | |
| 5,863,622 A | 1/1999 | Jester | |
| 6,417,899 B1 | 7/2002 | Jones et al. | |
| 7,144,608 B2 | 12/2006 | Paukshto et al. | |
| 7,443,585 B2 | 10/2008 | Hara et al. | |
| 8,446,548 B2 | 5/2013 | Uehara | |
| 2006/0290853 A1 | 12/2006 | Hong et al. | |
| 2007/0268427 A1* | 11/2007 | Uehara | G02F 1/1323 349/62 |
| 2009/0002620 A1* | 1/2009 | Yamashita | C08L 53/00 349/137 |
| 2009/0161044 A1 | 6/2009 | Ge et al. | |
| 2016/0093833 A1* | 3/2016 | No | H01L 51/5293 257/40 |
| 2017/0307811 A1* | 10/2017 | Zhao | G02B 6/0229 |

* cited by examiner

*Primary Examiner* — Anthony J Frost
(74) *Attorney, Agent, or Firm* — Treyz Law Group, P.C.; Joseph F. Guihan

(57) ABSTRACT

An electronic device may have a display such as an organic light-emitting diode display. A compensation film may be used to correct the color shift in the display. The compensation film may include a layer of liquid crystals and dye aligned with the liquid crystals. The dye may be configured to absorb different amounts of light depending on an angle that the light passes through the compensation film. Higher angled light will have a longer path length through the compensation film and therefore more of the higher angled light will be absorbed by the dye. The dye may therefore compensate for the color shift that occurs at high viewing angles.

18 Claims, 9 Drawing Sheets

DISPLAY HAVING A COMPENSATION FILM WITH LIGHT ABSORBING DYE

This application claims priority to U.S. provisional patent application No. 62/901,116 filed Sep. 16, 2019, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels or a liquid crystal display (LCD) based on liquid crystal pixels. Sometimes, displays may have non-uniform emission of light at different viewing angles. This can cause the display to appear tinted by a certain color (e.g., a color shift) at high viewing angles, for example. If care is not taken, correcting color shift at high viewing angles may cause color shift at on-axis viewing angles or may adversely affect display efficiency.

It is within this context that the embodiments herein arise.

SUMMARY

An electronic device may have a display such as an organic light-emitting diode display. At high viewing angles, the display may have a perceptible color shift. For example, there may be a yellow tint to the display at high viewing angles.

A compensation film may be used to correct the color shift in the display. The compensation film may include a layer of liquid crystals and dye aligned with the liquid crystals. The dye may be configured to absorb different amounts of light depending on an angle that the light passes through the compensation film. Higher angled light will have a longer path length through the compensation film and therefore more of the higher angled light will be absorbed by the dye. The dye may therefore compensate for the color shift that occurs at high viewing angles.

In some arrangements, the compensation film may be interposed between a circular polarizer and an organic light-emitting diode display. A display cover layer may cover the organic light-emitting diode display. An optical coupling layer may be interposed between the circular polarizer and the display cover layer. The optical coupling layer may be formed by a coherent fiber bundle. The optical coupling layer may transfer an image produced by the organic light-emitting diode display from an input surface of a first shape at a first location to an output surface with a curved cross-sectional profile, compound curvature, or other desired second shape at a second location.

DETAILED DESCRIPTION

Figure 1:
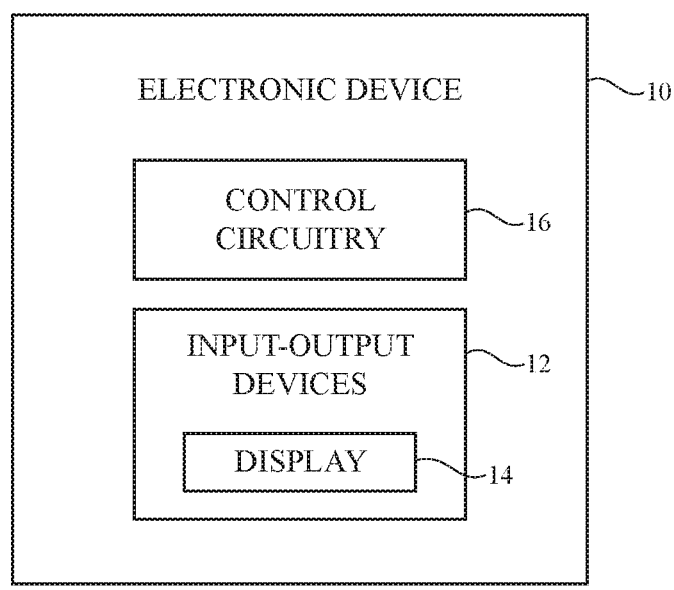
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Figure 2:
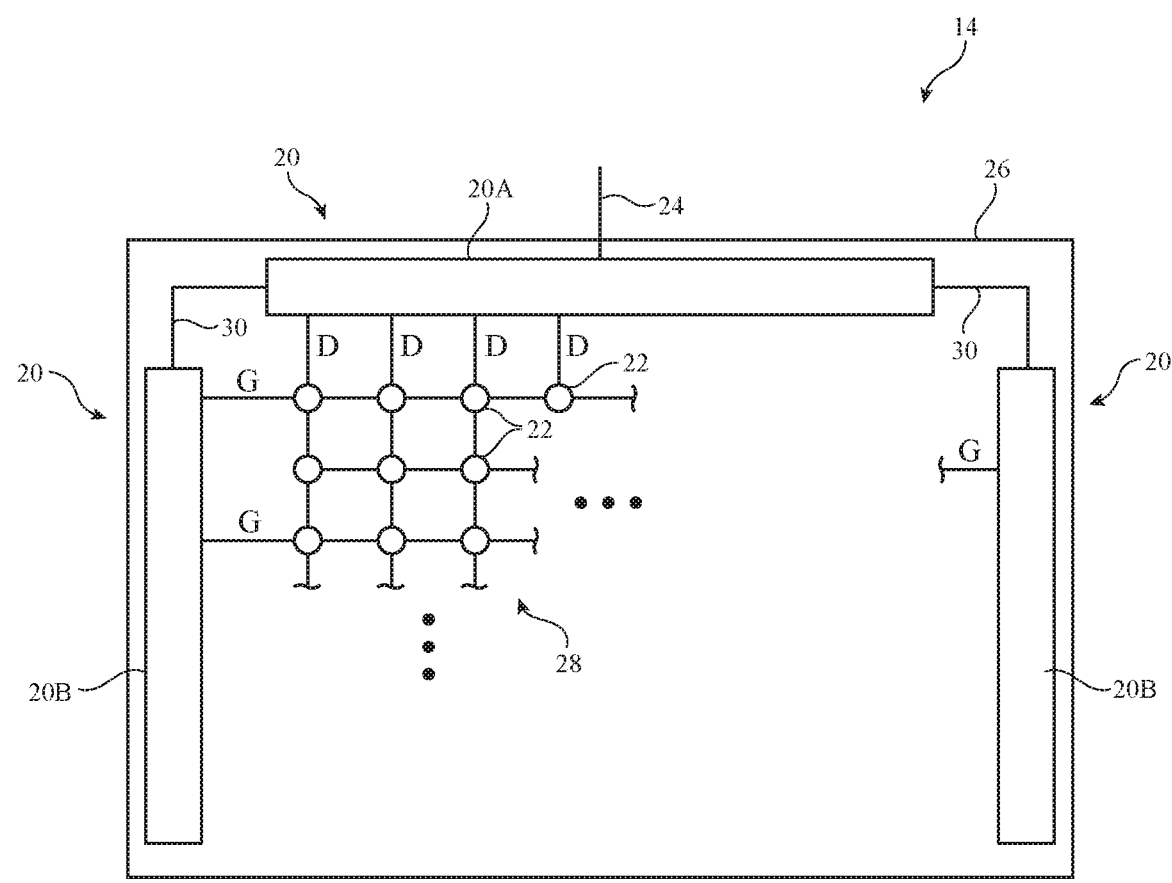
FIG. 2 is a schematic diagram of an illustrative display in accordance with an embodiment.

FIG. 2 is a diagram of an illustrative display 14. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels. Pixels of other colors such as cyan, magenta, and yellow might also be used.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally across display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
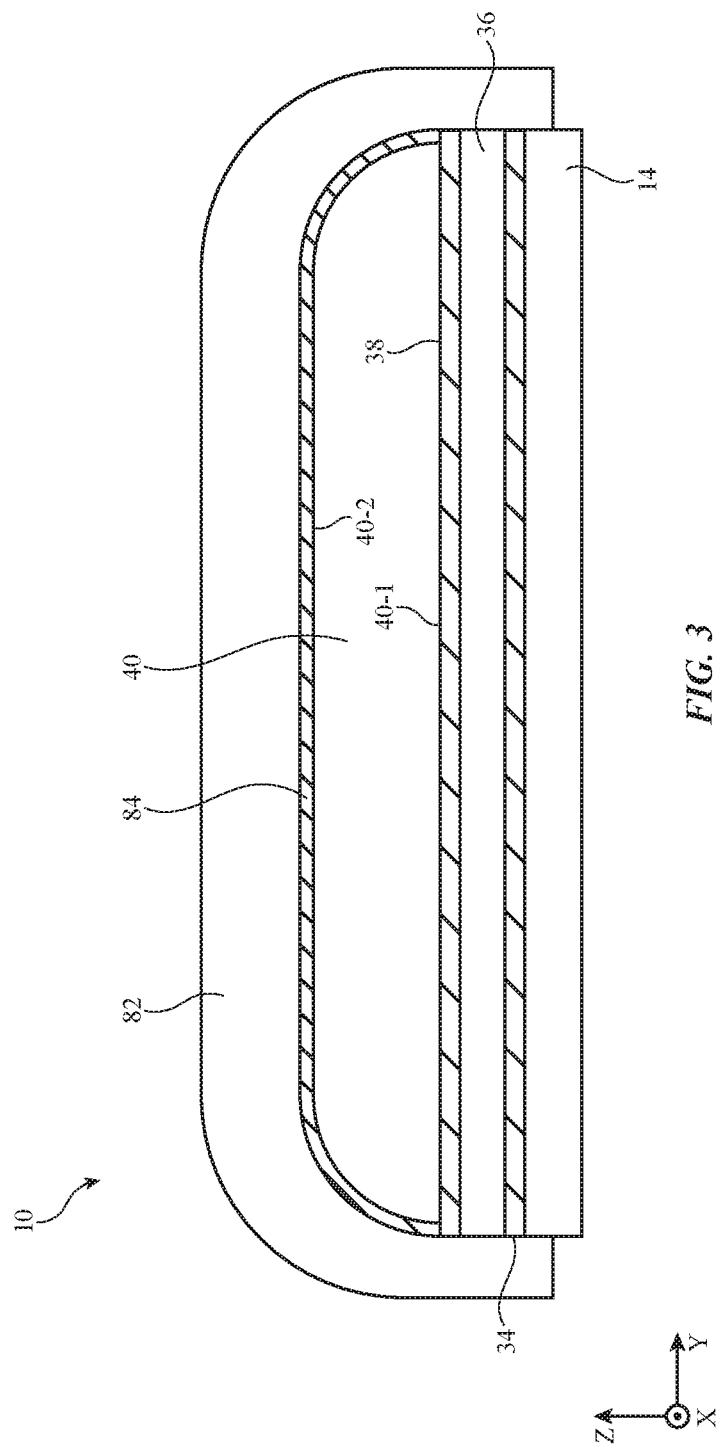
FIG. 3 is a cross-sectional side view of an illustrative electronic device with an optical coupling layer in accordance with an embodiment.

FIG. 3 is a cross-sectional side view of an illustrative electronic device with a display covered by an optical coupling layer. As shown in FIG. 3, electronic device 10 includes display 14 (sometimes referred to as display panel 14). The device may also include a polarizer layer 36. Polarizer layer 36 may be used to mitigate reflections of ambient light off of the display panel, impart a desired polarization on light emitted by the pixels of display 14, etc. Polarizer layer 36 may include one or more layers (sometimes referred to as sublayers) and therefore may be referred to as a polarizer stack-up 36, optical film stack-up 36, optical layers 36 etc. Optical layers 36 may include a circular polarizer formed by a quarter wave plate and a linear polarizer, in one example.

An optical coupling layer 40 may also optionally be incorporated into the device. Optical coupling layer 40 may serve as a protective display cover layer (and may sometimes be referred to as forming a transparent portion of the housing for device 10). Additional protective layers (e.g., transparent layers of glass, crystalline material such as sapphire, etc.) may be stacked above and/or below optical coupling layer 40. For example, FIG. 3 shows an additional protective layer 82 formed over optical coupling layer 40. Protective layer 82 may also sometimes be referred to as forming a transparent portion of the housing for device 10. Optical film stack-up 36, optical coupling layer 40, and/or display cover layer 82 may sometimes be referred to as being a part of display 14.

Optical coupling layer 40 may serve to transport light (e.g., image light and/or other light) from one surface (e.g., the inner surface 40-1 of optical coupling layer 40 facing display 14) to another (e.g., the outer surface 40-2 of optical coupling layer 40 facing a viewer) while preserving the integrity of the image light or other light. This allows an image produced by an array of pixels in a flat or curved display panel to be transferred from an input surface of a first shape at a first location to an output surface with a curved cross-sectional profile, compound curvature, or other desired second shape at a second location. The optical coupling layer may therefore move the location of an image and may optionally change the shape of the surface on which the image is presented.

In general, optical coupling layers may be formed from any desired materials. For example, the optical coupling layers may be formed from a coherent fiber bundle or Anderson localization material. A coherent fiber bundle may include a plurality of fibers that each have fiber cores (e.g., polymer or glass) of a first refractive index surrounded by cladding (e.g., polymer) of a second (e.g., lower) refractive index. Anderson localization material is characterized by transversely random refractive index features (higher index regions and lower index regions) of about two wavelengths in lateral size that are configured to exhibit two-dimensional transverse Anderson localization of light (e.g., the light output from the display of device 10). These refractive index variations are longitudinally invariant (e.g., along the direction of light propagation, perpendicular to the surface normal of a layer of Anderson localization material). Regardless of the material used, the optical coupling layer may allow an image received at input surface 40-1 to be presented at output surface 40-2 without mixing of the image.

Adhesive layers may be interposed between adjacent portions of the electronic device. For example, adhesive layer 34 is interposed between polarizer 36 and display 14. Adhesive layer 38 is interposed between polarizer 36 and optical coupling layer 40. Adhesive layer 84 is interposed between optical coupling layer 40 and display cover layer 82. Each one of adhesive layers 34, 38, and 84 may be transparent. Each one of adhesive layers 34, 38, and 84 may be formed from pressure sensitive adhesive, optically clear adhesive (OCA), liquid optically clear adhesive (LOCA), etc. The different adhesive layers may be formed from the same material or different materials.

The example in FIG. 3 of electronic device 10 including optical coupling layer 40 is merely illustrative. It should be understood that optical coupling layer 40 may be omitted from the device if desired, with display cover layer 82 covering polarizer 36 and display 14 without an intervening optical coupling layer. Additionally, device 10 may include additional housing structures (e.g., opaque or transparent housing structures) that form a housing in combination with cover layer 82. The housing may support internal components within an interior of the electronic device.

Figure 4:
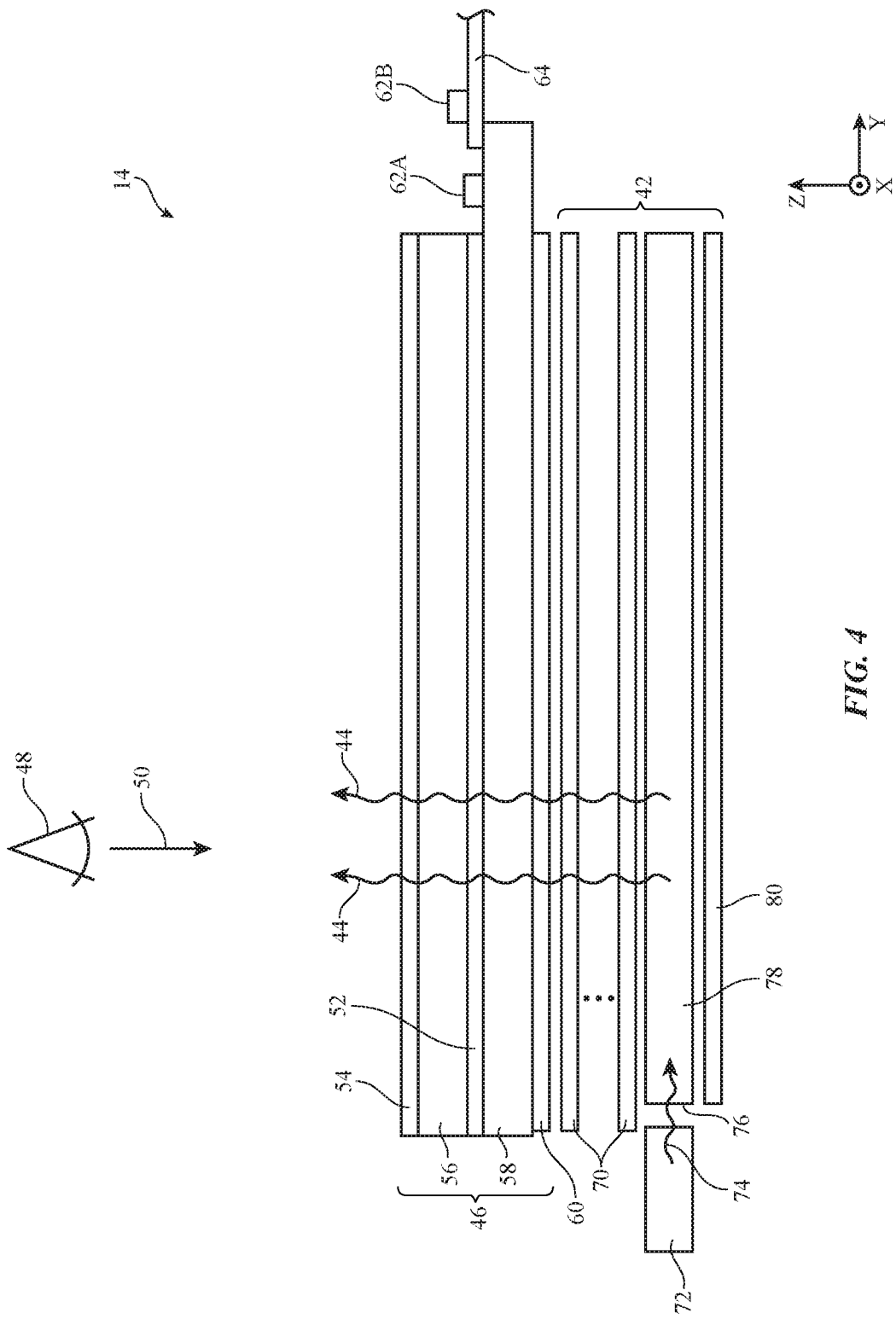
FIG. 4 is a cross-sectional side view of an illustrative liquid crystal display that may be covered by a compensation film in accordance with an embodiment.

A cross-sectional side view of an illustrative configuration for display 14 of device 10 (e.g., for display 14 of the device of FIG. 3 or other suitable electronic device) is shown in FIG. 4. As shown in FIG. 4, display 14 may include backlight structures such as backlight unit 42 for producing backlight 44. During operation, backlight 44 travels outwards (vertically upwards in dimension Z in the orientation of FIG. 4) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in the electronic device housing or display layers 46 may be mounted directly in the electronic device housing (e.g., by stacking display layers 46 into a recessed portion in the electronic device housing). Display layers 46 may form a liquid crystal display or may be used in forming displays of other types.

In a configuration in which display layers 46 are used in forming a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer (e.g., a thin-film transistor substrate such as substrate 28) that includes an array of thin-film transistors and associated electrodes (display pixel electrodes) for applying electric fields to liquid crystal layer 52 and thereby displaying images on display 14. Layer 56 may be a color filter layer that includes an array of color filter elements for providing display 14 with the ability to display color images. If desired, layer 58 may be a color filter layer and layer 56 may be a thin-film transistor layer.

During operation of display 14 in device 10, control circuitry (e.g., one or more integrated circuits on a printed circuit) may be used to generate information to be displayed on display 14 (e.g., display data). The information to be displayed may be conveyed to a display driver integrated circuit such as circuit 62A or 62B using a signal path such as a signal path formed from conductive metal traces in a rigid or flexible printed circuit such as printed circuit 64 (as an example).

Backlight structures 42 may include a light guide plate such as light guide plate 78 (sometimes referred to herein as a light guide layer). Light guide layer 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide layer 78 and may be distributed in dimensions X and Y throughout light guide layer 78 due to the principal of total internal reflection. Light guide layer 78 may include light-scattering features such as pits or bumps.

The light-scattering features may be located on an upper surface and/or on an opposing lower surface of light guide plate 78.

Light 74 that scatters upwards in direction Z from light guide layer 78 may serve as backlight 44 for display 14. Light 74 that scatters downwards may be reflected back in the upwards direction by reflector 80. Reflector 80 may be formed from a reflective material such as a layer of white plastic or other shiny materials.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films) for collimating backlight 44. Optical films 70 may overlap the other structures in backlight unit 42 such as light guide layer 78 and reflector 80. For example, if light guide plate 78 has a rectangular footprint in the X-Y plane of FIG. 4, optical films 70 and reflector 80 may have a matching rectangular footprint.

Lower polarizer layer 60 and upper polarizer layer 54 may be linear polarizers with optical axes that are offset by 90°. The linear polarizers may (in combination with liquid crystal layer 52) allow per-pixel control of the magnitude of emitted light. After the light passes through upper polarizer 54, the light may be linearly polarized.

Figure 5:
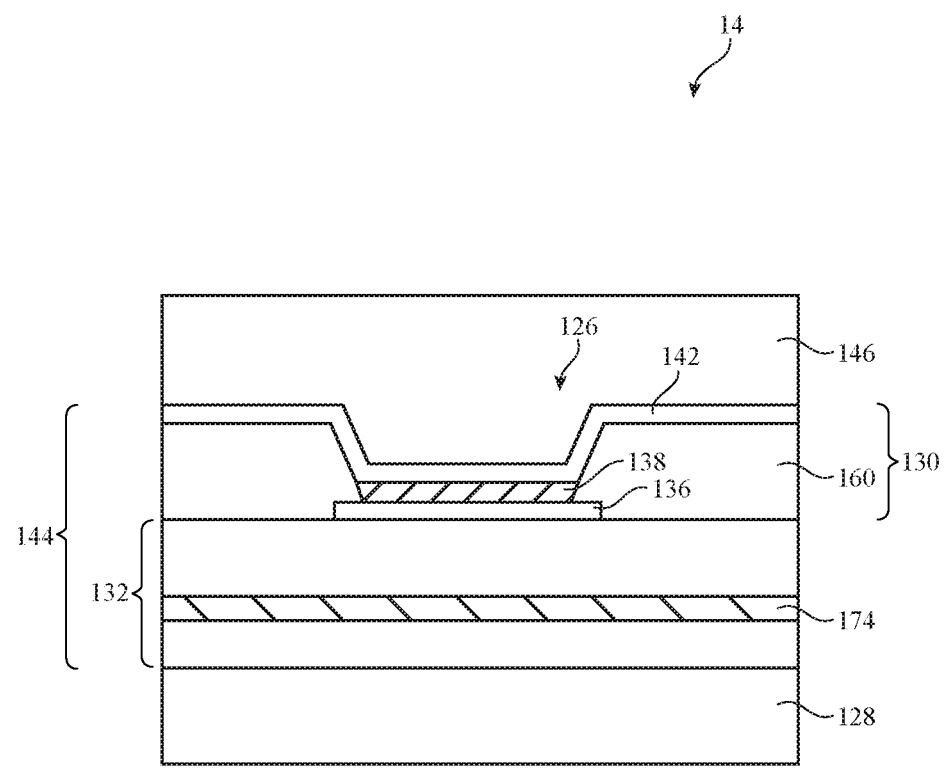
FIG. 5 is a cross-sectional side view of an illustrative organic light-emitting diode display that may be covered by a compensation film in accordance with an embodiment.

The example in FIG. 4 of display 14 being a liquid crystal display with backlight structures is merely illustrative. If desired, display 14 may instead be another type of display such as an organic light-emitting diode display. A cross-sectional side view of a portion of an illustrative organic light-emitting diode display is shown in FIG. 5. As shown in FIG. 5, display 14 may include a substrate layer such as substrate layer 128. Substrate 128 may be formed from a polymer or other suitable materials.

Thin-film transistor circuitry 144 (sometimes referred to as display layers 144) may be formed on substrate 128. Thin film transistor circuitry 144 may include layers 132. Layers 132 may include inorganic layers such as inorganic buffer layers, barrier layers (e.g., barrier layers to block moisture and impurities), gate insulator, passivation, interlayer dielectric, and other inorganic dielectric layers. Layers 132 may also include organic dielectric layers such as a polymer planarization layer. Metal layers and semiconductor layers may also be included within layers 132. For example, semiconductors such as silicon, semiconducting-oxide semiconductors, or other semiconductor materials may be used in forming semiconductor channel regions for thin-film transistors. Metal in layers 132 such as metal traces 174 may be used in forming transistor gate terminals, transistor source-drain terminals, capacitor electrodes, and metal interconnects.

As shown in FIG. 5, display layers 144 may include diode anode structures such as anode 136. Anode 136 may be formed from a layer of conductive material such as metal on the surface of layers 132 (e.g., on the surface of a planarization layer that covers underlying thin-film transistor structures). Light-emitting diode 126 may be formed within an opening in pixel definition layer 160. Pixel definition layer 160 may be formed from a patterned photoimageable polymer such as polyimide and/or may be formed from one or more inorganic layers such as silicon nitride, silicon dioxide, or other suitable materials.

In each light-emitting diode, layers of organic material 138 may be interposed between a respective anode 136 and cathode 142. Anodes 136 may be patterned from a layer of metal (e.g., silver) and/or one or more other conductive layers such as a layer of indium tin oxide or other transparent conductive material. Cathode 142 may be formed from a common conductive layer that is deposited on top of pixel definition layer 160. Cathode 142 may be formed from a thin metal layer (e.g., a layer of metal such as a magnesium silver layer) and/or indium tin oxide or other transparent conductive material. Cathode 142 is preferably sufficiently transparent to allow light to exit light emitting diode 126. In some embodiments, cathode 142 may be partially transparent to form an optical cavity between anode 136 and cathode 142, thereby increasing the efficiency of transmittance of a desired wavelength.

If desired, the anode of diode 126 may be formed from a blanket conductive layer and the cathode of diode 126 may be formed from a patterned conductive layer. The illustrative configuration of display 14 in which a transparent blanket cathode layer 142 covers diodes that have individually patterned anodes 136 allows light to be emitted from the top of display 14 (i.e., display 14 in the example of FIG. 5 is a "top emission" organic light-emitting diode display). Display 14 may be implemented using a bottom emission configuration if desired. Layers such as layers 136, 138, and 142 are used in forming organic light-emitting diodes such as diode 126 of FIG. 5, so this portion of display 14 is sometimes referred to as an organic light-emitting diode layer (see, e.g., layer 130 of FIG. 5).

Organic layer 138 may include an organic emissive layer (e.g., a red emissive layer in red diodes that emits red light, a green emissive layer in green diodes that emits green light, and a blue emissive layer in blue diodes that emits blue light, etc.). The emissive material may be a material such as a phosphorescent material or fluorescent material that emits light during diode operation. The emissive material in layer 138 may be sandwiched between additional diode layers such as hole injection layers, hole transport layers, electron injection layers, and electron transport layers.

The examples in FIGS. 4 and 5 of the types of displays that may be used in the electronic device of FIG. 3 are merely illustrative. Other types of displays may be used if desired.

In some cases, a display may have a color shift at high viewing angles. There are numerous factors that can cause color shift. In the arrangement of FIG. 3, the optical coupling layer 40 may be formed from a polymer material that absorbs more blue light than yellow light. More yellow light than blue light may pass through the optical coupling layer. This effect may be exacerbated at high viewing angles due to increased internal reflections of high-angled light within the optical coupling layer. Therefore, the display may have a perceived yellow tint (referred to as a yellow color shift) at high viewing angles.

Other causes may contribute to off-axis color shift in electronic devices. As discussed in connection with FIG. 5, display 14 may include organic light-emitting diode pixels. The organic light-emitting diode pixels may have emissive material that is interposed between an anode and a cathode. In some cases, the organic light-emitting diode pixels may have an optical cavity defined by a partially reflective cathode. The thickness of the cavity may be tuned to increase transmittance of a desired wavelength. OLED pixels of this type (sometimes referred to as microcavity OLED pixels) may emit more yellow light at off-axis viewing angles than at on-axis viewing angles. This may also contribute to a yellow color shift at high viewing angles when a user is viewing the display of the electronic device.

Figure 6:
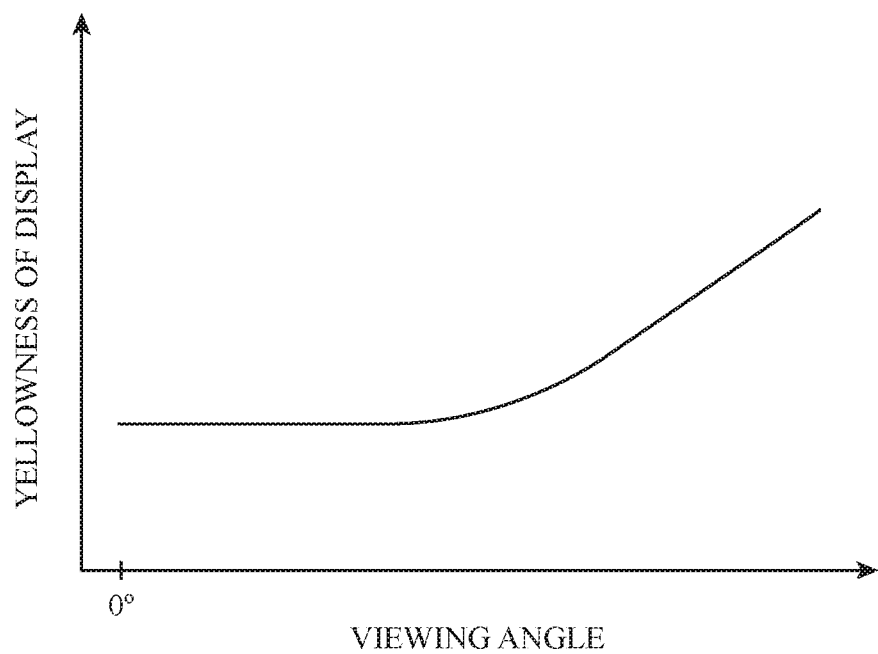
FIG. 6 is a graph showing the yellowness of the display of FIG. 3 as a function of viewing angle in accordance with an embodiment.

FIG. 6 is a graph showing the aforementioned color shift of the display. FIG. 6 shows the yellowness of the display as a function of viewing angle of the display. At an on-axis angle such as 0° (e.g., a direction perpendicular to the front face of the electronic device), the display may not exhibit any yellow color shift. However, as the viewing angle (e.g., as the angle between the normal of the front face of the electronic device and the direction of view) increases to high viewing angles the perceived yellowness of the display increases. As previously mentioned, this increased yellow at high viewing angles may be caused by blue light absorption within optical coupling layer 40, may be caused by the emission profile of the OLED pixels in the display, etc.

Figure 7:
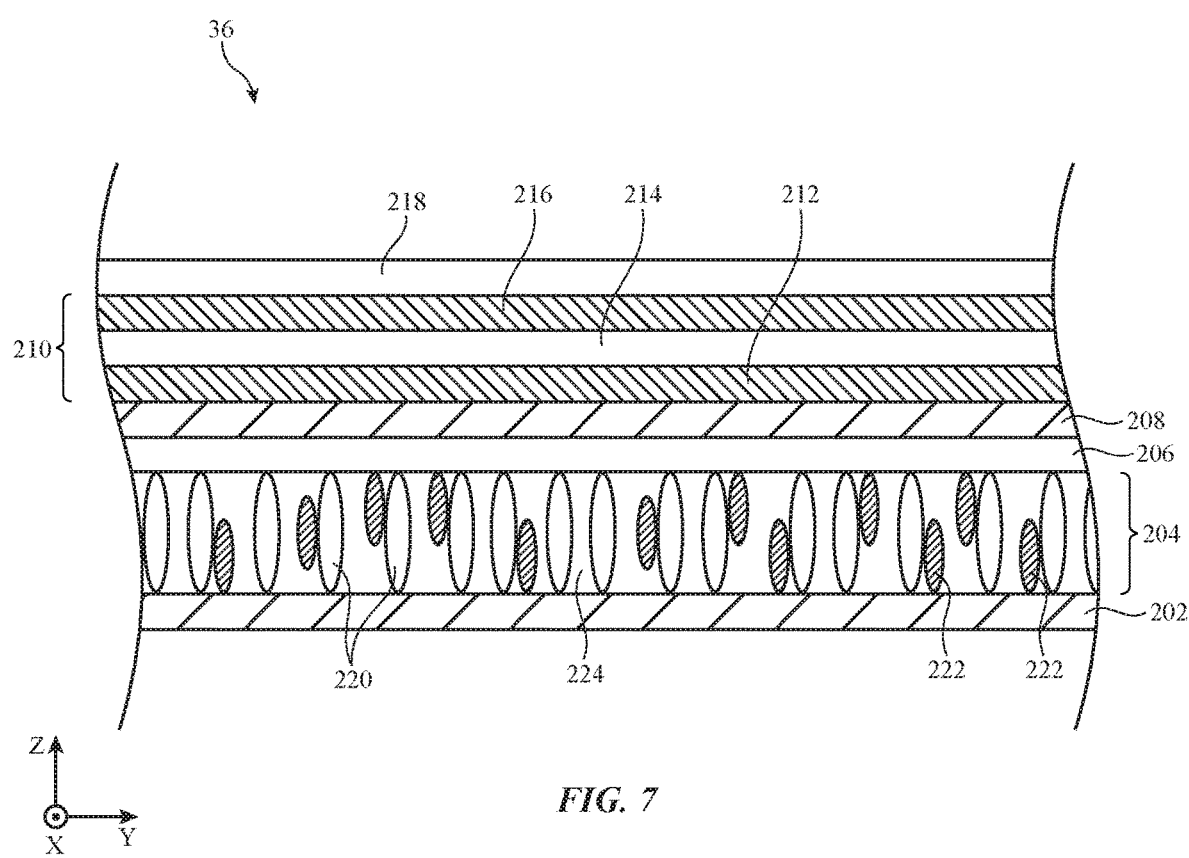
FIG. 7 is a cross-sectional side view of an illustrative polarizer stack-up that may be used in the electronic device of FIG. 3 to compensate for color shift at high viewing angles in accordance with an embodiment.

To reduce yellow color shift at high viewing angles, a yellow light absorbing dye may be incorporated into the polarizer stack-up of the electronic device. An example of this type of polarizer stack-up is shown in FIG. 7. The polarizer stack-up 36 of FIG. 7 may be used in the arrangement of FIG. 3 when the display is an organic light-emitting diode display, may be used in the arrangement of FIG. 3 when the display is a liquid crystal display, may be used in the arrangement of FIG. 3 when the optical coupling layer is omitted, etc.

As shown in FIG. 7, the polarizer stack-up 36 may include a linear polarizer 210 formed from a polarizing layer 214 and substrates 212 and 216. Polarizing layer 214 may be formed from poly(vinyl alcohol) (PVA) that linearly polarizes light that passes through the layer. Substrates 212 and 216 may be formed from an in isotropic material such as cyclo olefin polymer (COP), tri acetate cellulose (TAC), poly(methyl methacrylate) (PMMA), or another desired material. This example of layers that form a linear polarizer is merely illustrative. In general, the linear polarizer may have any desired arrangement (e.g., multiple PVA layers separated by respective isotropic layers).

An adhesive layer 208 may attach substrate 212 of linear polarizer 210 to quarter wave plate 206. The adhesive layer 208 may be a pressure sensitive adhesive (PSA) layer or any other desired type of adhesive. Adhesive layer 208 may be transparent. Quarter wave plate 206 is formed from a birefringent material and serves as a retarder. The quarter wave plate (QWP) may sometimes be referred to as retarder 206.

The optical layers 36 also include a compensation film 204. An adhesive layer 202 may be used to attach the optical film stack-up 36 to an underlying display panel. The adhesive layer 202 may be a pressure sensitive adhesive (PSA) layer or any other desired type of adhesive. Adhesive layer 202 may be transparent. The adhesive layer 202 may be used in addition to or instead of the adhesive layer 34 depicted in FIG. 3. A hard coating 218 may cover the optical film stack-up. The hard coating may be formed from a polymer material or other desired material and may form a protective layer over the polarizer layers. Hard coating 218 may therefore sometimes be referred to as protective coating 218.

The display panel may be positioned under adhesive layer 202 and may emit light through the polarizer towards the viewer (e.g. in the direction of the Z-axis). In other words, light from the display panel passes through the compensation film 204, quarter wave plate 206, and linear polarizer 210 in that order before reaching the viewer.

Linear polarizer 210 and the quarter wave plate 206 collectively serve as a circular polarizer. The circular polarizer may mitigate reflections of ambient light off of the display panel.

The compensation film 204 may be formed from liquid crystals 220 in an interstitial material 224. The liquid crystals 220 of the compensation film are birefringent. The liquid crystals in the compensation film may be aligned in a desired orientation. For example, in FIG. 7 the liquid crystals have an elongated shape (extend along an axis) that extends parallel to the Z-axis. In other words, the liquid crystals in the compensation film are aligned vertically. The liquid crystals may compensate for the retardation of the underlying display layers to make the luminance and color of the display more uniform across different viewing angles.

For example, on-axis light (light parallel to the Z-axis) may pass through fewer crystals than off-axis light at higher angles. This is because the path length of the on-axis light through the compensation film is shorter than the path length of the off-axis light through the compensation film. Accordingly, the effective retardation of the compensation film for on-axis light is less than the effective retardation of the compensation film for off-axis light.

The compensation film 204 may include an alignment film that causes the liquid crystals to be aligned in the desired orientation. Alternatively, the liquid crystals may be aligned during manufacturing and then cured in the desired alignment. An alignment film may be used to align the liquid crystals before the liquid crystals are cured in place to make the alignment rigid (static). The alignment film may then be omitted from the final electronic device if desired. Similarly, compensation film 204 may include a substrate for the liquid crystals. Alternatively, a substrate may be used during formation of the compensation film but then omitted from the final electronic device.

To compensate for off-axis color shift, compensation film 204 may also include a light absorbing dye 222. The light absorbing dye 222 may be formed from an organic dye that absorbs light of a desired color. In the example of the display having a yellow color shift at high viewing angles, the dye may absorb yellow light. The dye may be formed from elongated molecules that are aligned with the liquid crystals of the compensation film. Accordingly, the dye may effect off-axis light more than on-axis light. The path length of the on-axis light through the compensation film is shorter than the path length of the off-axis light through the compensation film. Accordingly, the amount of light absorbed by the dye is lower for on-axis light than for off-axis light.

The dye molecules may be radicals, causing the dye molecules to be aligned with the liquid crystals. The dye molecules are also elongated and may be aligned with the liquid crystals such that the dye molecules also extend parallel to the Z-axis (e.g., each dye molecule may extend along a respective axis that is parallel to the Z-axis). Each liquid crystal need not be aligned with a corresponding dye molecule. In some cases, a particular liquid crystal will not have an adjacent dye molecule. In general, the dye molecules may be uniformly distributed throughout the compensation film. The compensation film may have a dye weight percentage of 1.5% (e.g., 1.5% of the film by weight is dye, the remaining 98.5% of the film is the liquid crystals and associated interstitial material). This example is merely illustrative. The compensation film may have a dye weight percentage of 3.0%, between 1.5% and 10.0%, between 0.5% and 10.0%, between 0.5% and 5.0%, between 1.0% and 4.0%, between 1.0% and 2.0%, between 2.5% and 3.5%, between 1.0% and 10.0%, etc.

Figure 8:
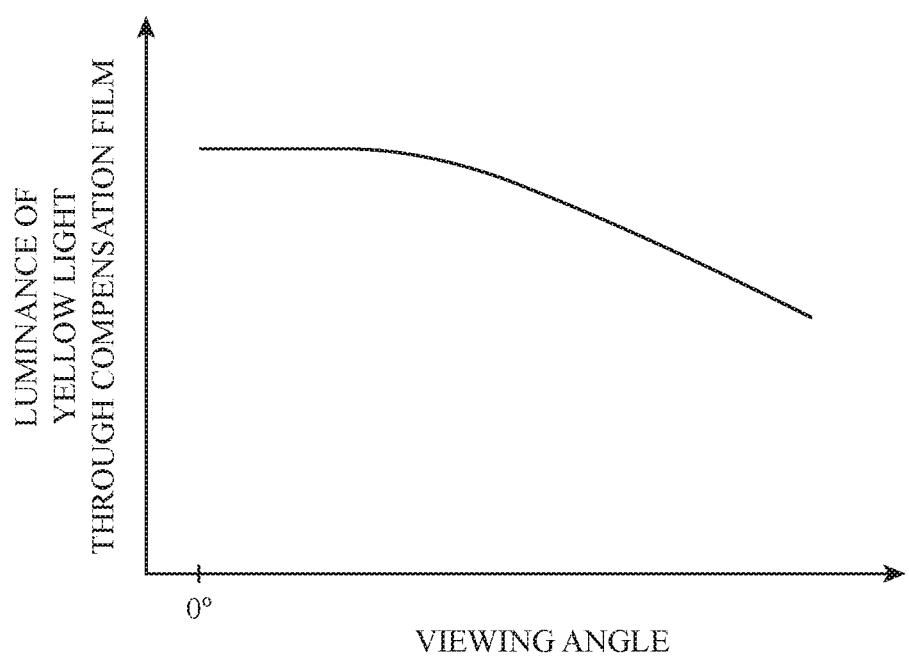
FIG. 8 is a graph of the luminance of yellow light through the compensation film of FIG. 7 as a function of viewing angle in accordance with an embodiment.

FIG. 8 is a graph showing the luminance of yellow light through the compensation film as a function of viewing angle. As shown, the luminance of yellow light through compensation film 204 decreases as viewing angle increases. For on-axis light (e.g., at 0°), only a small amount of yellow light may be absorbed and the luminance therefore remains relatively high. However, as the angle increases, more yellow light will be absorbed due to a longer path length through the compensation film. The shape of the luminance profile shown in FIG. 8 may be approximately the inverse of the emission profile of FIG. 6. Consequently, the compensation film compensates for the yellow color shift at high viewing angles to produce relatively uniform light at all viewing angles.

Figure 9:
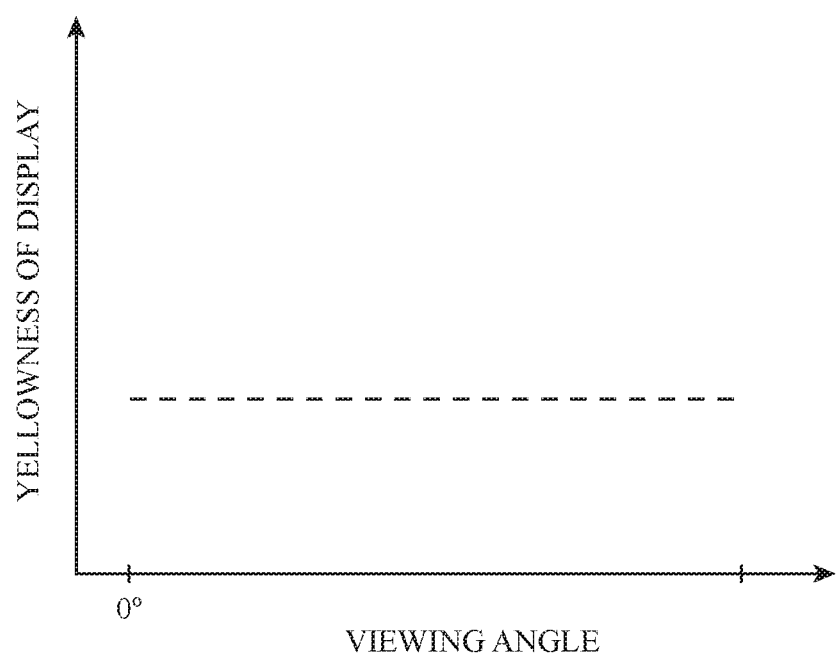
FIG. 9 is a graph showing the yellowness of the display of FIG. 3 as a function of viewing angle when the compensation film of FIG. 7 is used in accordance with an embodiment.

FIG. 9 is a graph showing the yellowness of the display as a function of viewing angle of the display when a compensation film including dye as shown in FIG. 7 is used. Similar to as in FIG. 6, at an on-axis angle such as 0° (e.g., a direction perpendicular to the front face of the electronic device), the display may not exhibit any yellow color shift. Due to the compensating effect of film 204 with dye 222, the perceived yellowness of the display may remain constant even as the viewing angle increases. There is therefore no perceived color shift even at high viewing angles.

Beneficially, because only a small amount of on-axis light is absorbed by the dye, the luminance of on-axis light is not substantially decreased. Therefore, the efficiency of the display remains high despite the presence of dye 222 in the polarizer stack-up. At high viewing angles, the luminance is slightly reduced due to the absorption of yellow light to reduce color shift. However, the uniform color at high viewing angles may be prioritized over this small drop in luminance at high viewing angles.

In the example of FIG. 7, the compensation film is used to correct for yellow color shift at high viewing angles. Therefore, dye 222 in the compensation film may be a blue dye that absorbs yellow light. It should be understood that this example is merely illustrative. The concept of incorporating dye 222 into the compensation film of the polarizer stack-up may be applied to displays with other types of color shift. For example, consider an example where the display has a blue color shift at high viewing angles (e.g., there is a perceptible blue tint to the display at high viewing angles). In this type of display, a yellow dye may be incorporated into the compensation film to absorb blue light at high viewing angles, correcting for the blue color shift. These dye colors are merely illustrative and any desired dye colors may be used (e.g., cyan dye, magenta dye, etc.). In some cases, a mixture of two or more dyes may be used in the compensation film. Any two dyes (e.g., yellow dye and cyan dye, yellow dye and magenta dye, magenta dye and cyan dye, etc.) may be mixed at any desired ratios (e.g., a 50/50 ratio, more than a 50/50 ratio, less than a 50/50 ratio, more than a 75/25 ratio, less than a 25/75 ratio, etc.). In general, if a display has an emission profile with a high amount of emitted light of a first color at high viewing angles, a corresponding dye (or mixture of dyes) may be used that is a second color and that absorbs light of the first color.

The foregoing is merely illustrative and various modifications can be made by those skilled in the art without departing from the scope and spirit of the described embodiments. The foregoing embodiments may be implemented individually or in any combination.

What is claimed is:

1. An electronic device comprising:
   an array of pixels that emit light;
   a display cover layer formed over the array of pixels;
   a compensation film that is interposed between the array of pixels and the display cover layer, wherein the compensation film comprises a layer of liquid crystals and dye aligned with the liquid crystals and wherein the dye is configured to absorb different amounts of light depending on an angle that the light passes through the compensation film to compensate for angle-dependent color shift;
   a linear polarizer that is interposed between the compensation film and the display cover layer;
   a quarter wave plate that is interposed between the compensation film and the linear polarizer; and
   a coherent fiber bundle that is interposed between the linear polarizer and the display cover layer.

2. The electronic device defined in claim 1, wherein the linear polarizer comprises a polarizing layer that is interposed between first and second substrate layers.

3. The electronic device defined in claim 2, further comprising:
   a layer of adhesive that attaches the quarter wave plate to the first substrate layer of the linear polarizer.

4. The electronic device defined in claim 3, further comprising:
   a protective coating that is formed over the second substrate layer of the linear polarizer; and
   an additional layer of adhesive that is interposed between the compensation film and the array of pixels.

5. The electronic device defined in claim 1, further comprising:
   a layer of optically clear adhesive that is interposed between the coherent fiber bundle and the display cover layer.

6. The electronic device defined in claim 1, wherein the dye comprises blue dye that absorbs yellow light.

7. The electronic device defined in claim 6, wherein the blue dye is configured to absorb a first amount of yellow light when light passes through the compensation film at a non-orthogonal angle, wherein the blue dye is configured to absorb a second amount of yellow light when light passes through the compensation film at an orthogonal angle, and wherein the second amount is less than the first amount.

8. The electronic device defined in claim 1, wherein:
   without the compensation film, the light exiting the display cover layer has a color shift of a first color at a given viewing angle; and
   the dye is configured to absorb light of the first color.

9. The electronic device defined in claim 8, wherein the dye is configured to absorb more light of the first color at the given viewing angle than at an additional viewing angle that is different than the given viewing angle.

10. The electronic device defined in claim 1, wherein the dye makes up a weight percentage of the compensation film and wherein the weight percentage is between 1.0% and 10.0%.

11. An electronic device comprising:
    an organic light-emitting diode display;
    a circular polarizer formed over the organic light-emitting diode display;
    a display cover layer that covers the circular polarizer and the organic light-emitting diode display;
    a coherent fiber bundle that is interposed between the circular polarizer and the display cover layer; and
    a compensation film that is interposed between the circular polarizer and the organic light-emitting diode display, wherein the compensation film comprises a layer of liquid crystals and a plurality of dye molecules that are aligned with the liquid crystals.

12. The electronic device defined in claim 11, wherein the plurality of dye molecules comprises blue dye molecules that absorb yellow light.

13. The electronic device defined in claim 11, wherein the plurality of dye molecules makes up a weight percentage of the compensation film and wherein the weight percentage is between 1.0% and 10.0%.

14. The electronic device defined in claim 11, wherein each one of the liquid crystals is elongated along a respective axis that extends perpendicular to the organic light-emitting diode display and wherein each one of the dye molecules is elongated along a respective axis that extends perpendicular to the organic light-emitting diode display.

15. The electronic device defined in claim 11, wherein the plurality of dye molecules comprise dye molecules selected from the group consisting of: blue dye molecules, cyan dye molecules, yellow dye molecules, and magenta dye molecules.

16. The electronic device defined in claim 11, wherein the plurality of dye molecules comprises a mixture of two or more types of dye molecules.

17. A display comprising:
  an organic light-emitting diode display panel having an array of display pixels;
  a circular polarizer that overlaps the organic light-emitting diode display panel;
  a coherent fiber bundle that overlaps the circular polarizer and the organic light-emitting diode display panel; and
  a compensation film that is interposed between the organic light-emitting diode display panel and the circular polarizer, wherein the compensation film includes liquid crystals and dye that absorbs yellow light to correct for yellow color shift in the display.

18. The electronic device defined in claim 11, wherein the coherent fiber bundle has first and second opposing surfaces, wherein the first surface faces the circular polarizer, wherein the second surface faces the display cover layer, and wherein the coherent fiber bundle transports light from the first surface to the second surface.

* * * * *